(12) United States Patent
Ahn et al.

(10) Patent No.: US 7,662,697 B2
(45) Date of Patent: Feb. 16, 2010

(54) METHOD OF FORMING ISOLATION STRUCTURE OF SEMICONDUCTOR DEVICE

(75) Inventors: Jung Ryul Ahn, Kyeongki-do (KR); Byung Soo Park, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 227 days.

(21) Appl. No.: 11/416,738

(22) Filed: May 2, 2006

(65) Prior Publication Data
US 2006/0252257 A1    Nov. 9, 2006

(30) Foreign Application Priority Data
May 3, 2005    (KR)    .................... 10-2005-0037110

(51) Int. Cl.
H01L 21/76    (2006.01)
(52) U.S. Cl. ............... 438/427; 438/424; 257/E21.546
(58) Field of Classification Search ................. 438/424, 438/427; 257/E21.546
See application file for complete search history.

(56) References Cited

U.S. PATENT DOCUMENTS

| | | | |
|---|---|---|---|
| 6,144,086 A | 11/2000 | Brown et al. | |
| 6,294,419 B1 * | 9/2001 | Brown et al. | ................ 438/221 |
| 6,486,517 B2 * | 11/2002 | Park | ........................... 257/374 |
| 6,774,017 B2 * | 8/2004 | Brown et al. | ................ 438/480 |
| 2002/0160579 A1 * | 10/2002 | Kim | ........................... 438/424 |
| 2005/0056908 A1 * | 3/2005 | Sato | ........................... 257/500 |
| 2007/0004167 A1 * | 1/2007 | Lee | ............................. 438/427 |

FOREIGN PATENT DOCUMENTS

| | | |
|---|---|---|
| JP | 05-315439 | 11/1993 |
| JP | 2000-049296 | 2/2000 |
| KR | 100165453 B1 | 9/1998 |
| KR | 2001-0054164 | 7/2001 |
| KR | 1020040102434 A | 12/2004 |

* cited by examiner

Primary Examiner—Bradley K Smith
(74) Attorney, Agent, or Firm—Townsend and Townsend and Crew LLP

(57) ABSTRACT

A method of forming a semiconductor device includes etching a semiconductor substrate to form a first trench having a first width and a first depth; etching the semiconductor substrate to form a second trench having a second width and a second depth, the second trench overlapping the first trench, the second width being greater than the first width, the second depth being less than the first depth, whereby a trench having a dual structure is formed; and forming a first isolation structure within the trench having the dual structure. An embodiment of the present invention relates to a method of forming an isolation structure of a semiconductor device.

11 Claims, 9 Drawing Sheets

METHOD OF FORMING ISOLATION STRUCTURE OF SEMICONDUCTOR DEVICE

BACKGROUND

The present invention relates to a method of forming an isolation structure of a semiconductor device. More particularly, the present invention relates to a method of forming an isolation structure of a semiconductor device, in which it can lower a field leakage and prevent an increase in the chip size and degradation of device characteristics.

To apply a high operating voltage to a semiconductor memory device, a high voltage device with a high blocking characteristic needs to be constructed. The flash memory device performs program, read and erase operations. To execute the program and erase operations, a high voltage is applied to the control gate or the bulk. The flash memory device accordingly requires the use of a high voltage transistor.

The program, read and erase operations are performed a page at a time. To control the program, read and erase operations, a page buffer is used to manage a string of cells. The page buffer also uses a high voltage transistor.

If the leakage current occurs between the junctions of adjacent high voltage transistors, a memory cell to which a high voltage is applied from a high voltage transistor cannot effectively serve as a storage device.

Furthermore, during the erase operation, a high erase voltage is applied to the bulk of the memory cell in order to form a forward bias between the bulk and the junction. If a breakdown voltage of the junction itself is lower than an erase operating voltage, the erase operating voltage is lowered due to the leakage current, resulting in chip erase fail.

In the related art, to lower the leakage current, one method used is to increase the distance between the junctions of the high voltage transistors. Another method involves injecting field-stop ions into the isolation trench so that a reverse bias is formed with respect to voltage conditions applied to the junction.

The method of increasing the distance between the junctions may include extending a horizontal distance between the junctions by widening a width of the isolation structure formed between the junctions or extending a vertical distance between the junctions by increasing the depth of the isolation trench.

However, the memory cell size increases if the width of the isolation structure is increased. This makes it difficult to make the device smaller. If the isolation trench is deep, it is not a significant problem in the peripheral region with a large pattern size, but burial failure occurs when the trench is buried with the insulating film in the memory cell region with a small pattern size, causing failure in the operation of the memory cell.

Figure 1:
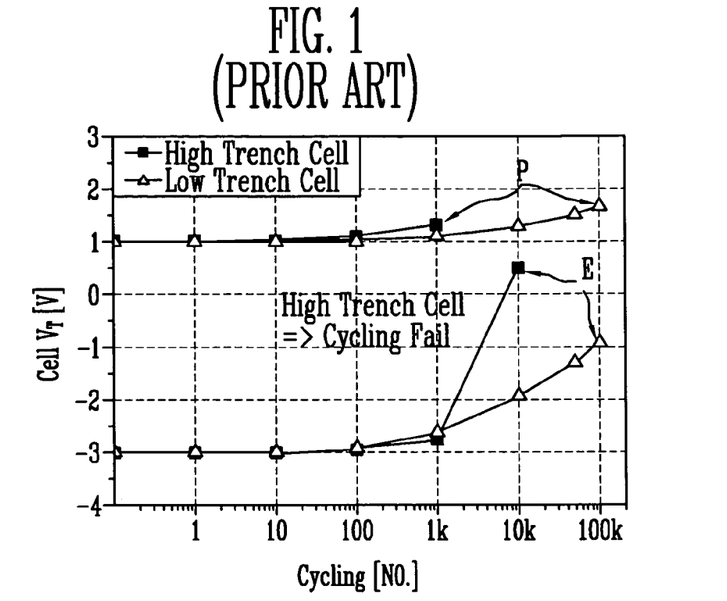
FIG. 1 is a graph showing a relationship between an E/W cycling characteristic and the depth of an isolation trench.

FIG. 1 is a graph showing a relationship between the Erase/Write (E/W) cycling characteristic and the depth of an isolation trench.

As shown in FIG. 1, the E/W cycling characteristic is relatively stable in a low trench cell with a shallow isolation trench having shallow depth. In a high trench cell with a deep isolation trench, however, a program threshold voltage (P) and an erase threshold voltage (E) abruptly rise after 1K E/W cycling, generating a device failure. Such a phenomenon is believed to occur because the burial characteristic of an insulating material is degraded as the depth of the trench is increased.

As an alternative method for overcoming the problem, a method in which a depth of the trench in the peripheral region having a high voltage device formed therein is deep while keeping shallow the depth of the trench in the memory cell region has been proposed.

To form a deep trench in the peripheral region, a dry etch process employing plasma is used. The plasma process causes the segregation of boron (B) injected into the substrate, thereby generating problems such as channel leakage, punch through and hump (i.e., leakage between the source and the drain). This leads to degraded device characteristics.

Figure 2A:
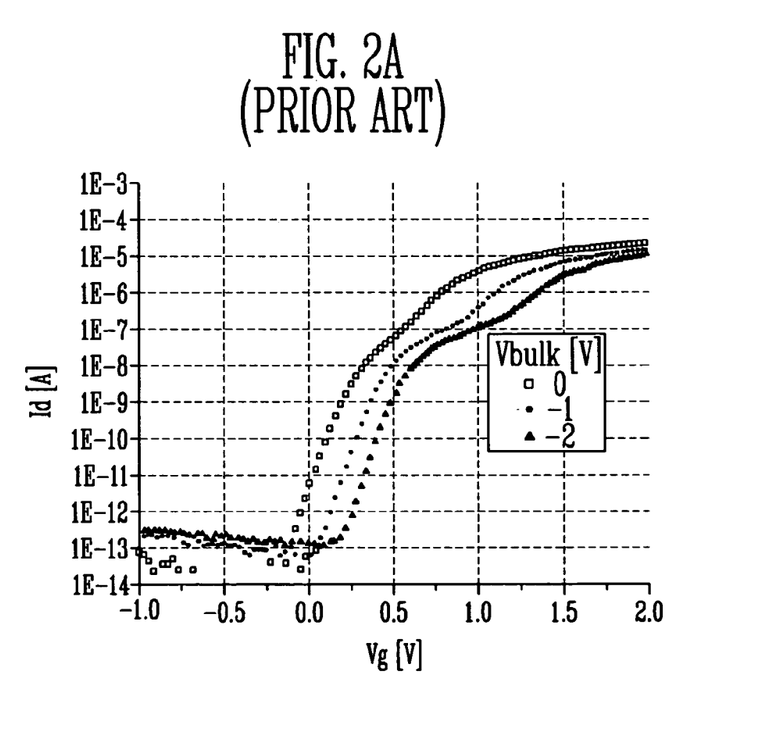
FIG. 2A is a graph showing the relationship between the drain current ($I_d$) and the gate voltage ($V_g$) on a bulk-voltage ($V_{bulk}$) basis when the isolation trench is deep.
Figure 2B:
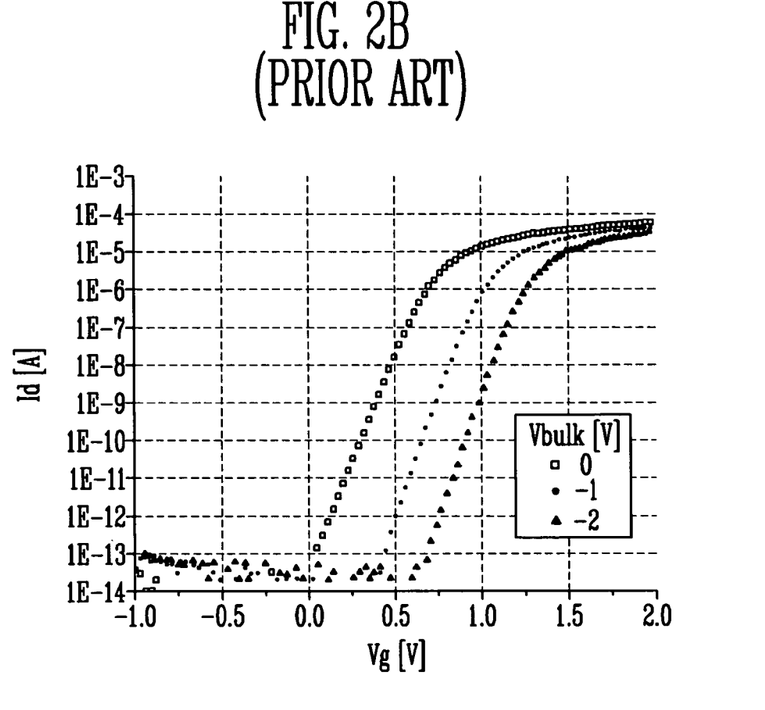
FIG. 2B is a graph showing the relationship between the drain current ($I_d$) and the gate voltage ($V_g$) on a bulk-voltage ($V_{bulk}$) basis when the isolation trench is shallow.

FIG. 2A is a graph showing the relationship between the drain current ($I_d$) and the gate voltage ($V_g$) on a bulk-voltage ($V_{bulk}$) basis when the isolation trench is deep. FIG. 2B is a graph showing the relationship between the drain current ($I_d$) and the gate voltage ($V_g$) on a bulk-voltage ($V_{bulk}$) basis when the isolation trench is shallow.

From FIGS. 2A and 2B, it can be seen that a hump is not generated when the isolation trench is shallow. When the isolation trench is deep, however, the boron segregation in the active region results when a deep trench is formed. As the leakage occurs between the source and the drain, a hump in which a graph curve showing variation in the drain current ($I_d$) depending on the gate voltage ($V_g$) is distorted is caused.

Furthermore, to form the trenches having different depths in the memory cell region and the peripheral region, three or more processes including a photolithography process, an etch process and a cleaning process are additionally performed. This increases the manufacturing cost and delays the device fabrication.

On the other hand, in the event that a field stop ion is injected below the isolation trench in order to form a reverse bias with respect to a voltage condition applied to the junction, if a breakdown voltage (BV) of the junction is lower than an erase voltage, the erase voltage is lowered due to the leakage and chip erase fail results.

Figure 3:
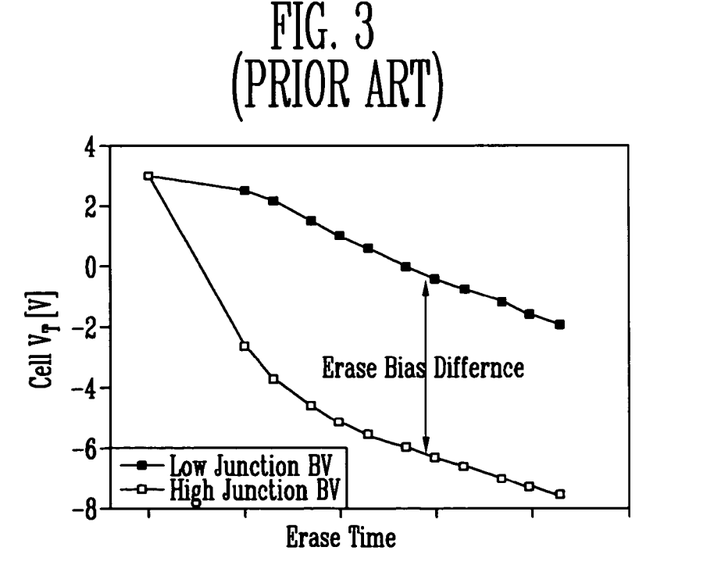
FIG. 3 is a graph illustrating a phenomenon in which the erase rate decreases as a junction breakdown voltage of a high voltage transistor is lowered.

FIG. 3 is a graph illustrating a phenomenon in which the erase rate decreases as a junction breakdown voltage of a high voltage transistor is lowered.

From FIG. 3, it can be seen that if the junction breakdown voltage (BV) is lowered, the erase time is increased if the cell threshold voltage is kept the same. In other words, the erase rate is lowered. Accordingly, since the erase is not completely performed, chip erase fail results.

SUMMARY OF THE INVENTION

An embodiment of the present invention relates to a method of forming an isolation structure of a semiconductor device, in which field leakage can be prevented without increasing the chip size.

Another embodiment of the present invention relates to a method of forming an isolation structure of a semiconductor device, in which field leakage can be prevented without degrading the E/W cycling characteristic of a memory cell.

Still another embodiment of the present invention relates to the prevention of field leakage without causing device characteristic failure.

Still another embodiment of the present invention relates to the prevention of field leakage without a chip erase fail phenomenon.

Still another embodiment of the present invention relates to the lowering of the device manufacturing cost and reduction of a device fabrication time.

A method of forming an isolation structure of a semiconductor device according to an embodiment of the present invention includes the steps of anisotropically etching a semiconductor substrate in which an isolation region will be formed to form a first trench, forming at least one second trench having a width narrower than that of the first trench in the semiconductor substrate below the first trench, thus forming a trench of a dual structure in which the first trench and the second trench are overlapping, and forming the isolation structure within the trench of the dual structure.

A method of forming an isolation structure of a semiconductor device according to another embodiment of the present invention includes the steps of anisotropically etching a part of a semiconductor substrate in which an isolation region will be formed to form a first trench, burying the first trench with a first insulating film, etching the semiconductor substrate of the isolation region to a depth shallower than that of the first trench by means of an anisotropic etch process, forming a second trench, and burying the second trench with a second insulating film to form an isolation structure of a dual structure having the first insulating film and the second insulating film.

In one embodiment, a method of forming a semiconductor device includes etching a semiconductor substrate to form a first trench having a first width and a first depth; etching the semiconductor substrate to form a second trench having a second width and a second depth, the second trench overlapping the first trench, the second width being greater than the first width, the second depth being less than the first depth, whereby a trench having a dual structure is formed; and forming a first isolation structure within the trench having the dual structure. The second trench is formed first and the first trench is then formed. Alternatively, the first trench is formed first and then the second trench.

The method further comprises filling the first trench with a first insulating material; and filling the second trench with a second insulating material. The first insulating material and the second insulating material comprise substantially the same material. The first and second trenches are filled with the first and second insulating materials at different process steps.

The first isolation structure is provided in a peripheral region of the device. The method further comprising forming a third trench in a memory cell region of the device, the third trench having a third width and a third depth, the third depth being less than the first depth; and forming a second isolation structure within the third trench. The third trench is formed at the time the second trench is formed. The third width is different from the second width.

In another implementation, a method of forming a semiconductor device includes anisotropically etching a portion of a semiconductor substrate in which an isolation region is to be formed to form a first trench; filling the first trench with a first insulating film; etching the semiconductor substrate form a second trench in the isolation region, the second trench being shallower than the first trench, the first and second trenches defining a trench having a dual structure; and filling the second trench with a second insulating film to form, wherein the first and second insulating films define an isolation structure of a dual structure.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

In the following detailed description, only certain exemplary embodiments of the present invention have been shown and described simply by way of illustration. As those skilled in the art will appreciate, the described embodiments may be modified in various different ways without departing from the spirit or scope of the present invention. Accordingly, the drawings and description are to be regarded as illustrative in nature and not restrictive. Like reference numerals designate like elements.

FIGS. 4A to 4E are cross-sectional views illustrating a method of manufacturing an isolation structure of a semiconductor device according to a first embodiment of the present invention.

Figure 4A:
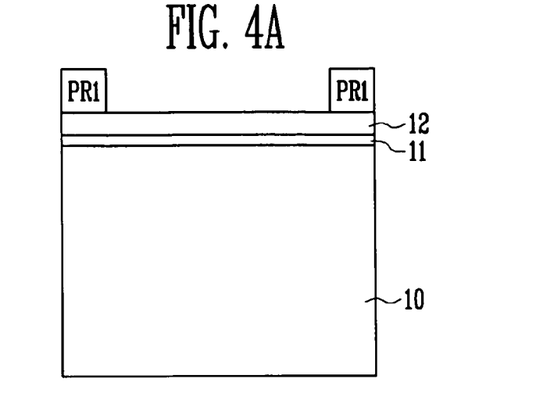
FIGS. 4A to 4E are cross-sectional views illustrating a method of manufacturing an isolation structure of a semiconductor device according to a first embodiment of the present invention.

As shown in FIG. 4A, a pad oxide film 11 and a pad nitride film 12 are formed on a semiconductor substrate 10. A first photoresist PR1 is formed on the pad nitride film 12.

The first photoresist PR1 is patterned by an exposure and development process so that the entire isolation region is opened.

Figure 4B:
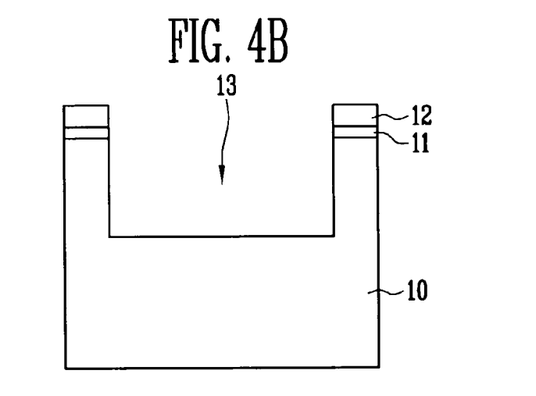

As shown in FIG. 4B, the pad nitride film 12, the pad oxide film 11 and the semiconductor substrate 10 are etched by an anisotropic etch process using the patterned first photoresist PR1 as a mask, thereby forming a first trench 13. In the etch process, the anisotropic etch process in the present embodiment. The etch process is performed such that the width of the first trench 13 may be accurately controlled, thereby accurately defining the width of an isolation structure to be formed within the first trench.

Figure 4C:
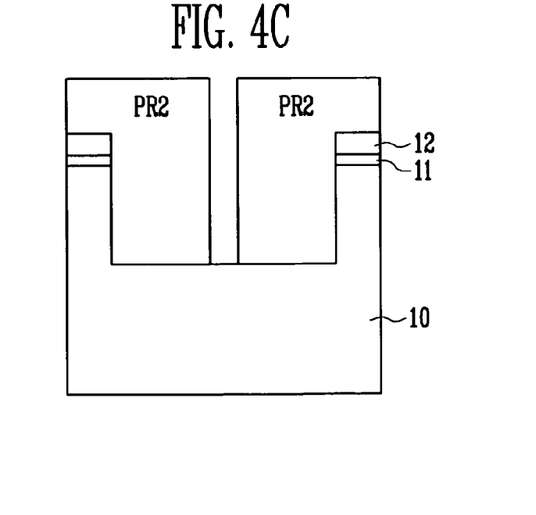

The first photoresist PR1 is stripped. As shown in FIG. 4C, a second photoresist PR2 is coated over the first trench 13 and is patterned by an exposure and development process, so that a portion of the first trench 13 is exposed.

Figure 4D:
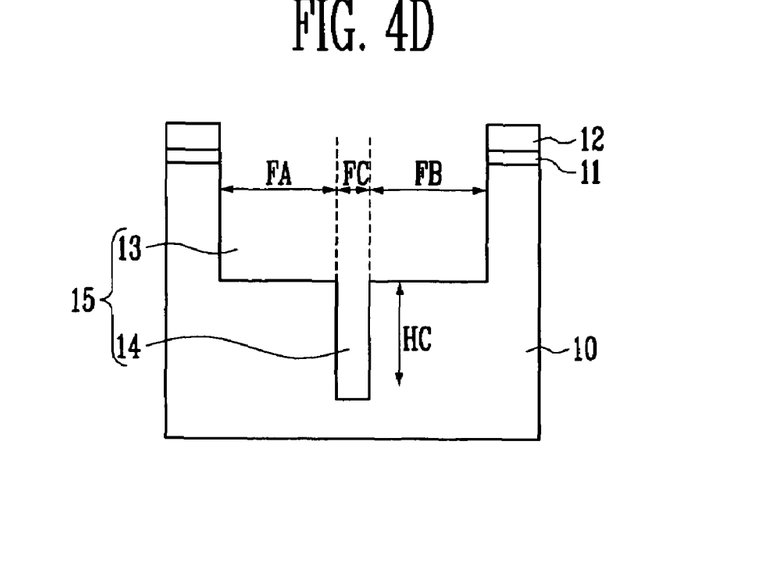

As shown in FIG. 4D, the semiconductor substrate 10 is etched to form a second trench 14 using the patterned second photoresist PR2 as a mask. The second photoresist PR2 is then stripped. At this time, the etch process for forming the second trench 14 involves an anisotropic etch process in the present embodiment. In other embodiments, an isotropic etch process may be used. In addition, to further improve a device isolation characteristic, field-stop ions may be injected into the semiconductor substrate 10 below the second trench 14 before the second photoresist PR2 is stripped.

A trench 15 having a dual structure in which the first trench 13 and the second trench 14 are overlapping is thereby formed.

In the present embodiment, the depth (HC) of the second trench 14 is at least 100 Å. The width (FC) of the second trench 14 is smaller than a first width (FA) of the first trench 13 and also smaller than a second width (FB) of the first trench 13. In other words, FC<Max{FA, FB}. The first width (FA) is a distance defined between one sidewall of the first trench to a corresponding sidewall of the second trench. Similarly, the second width is a distance defined between the other sidewall of the first trench to a corresponding sidewall of the second trench.

The lowest value of FA and FB may be 0 and the highest value of FA and FB may be [a width of the isolation region—the smallest width of FC]. In addition, more than one of the second trench 14 may be provided within the first trench according to implementation.

Figure 4E:
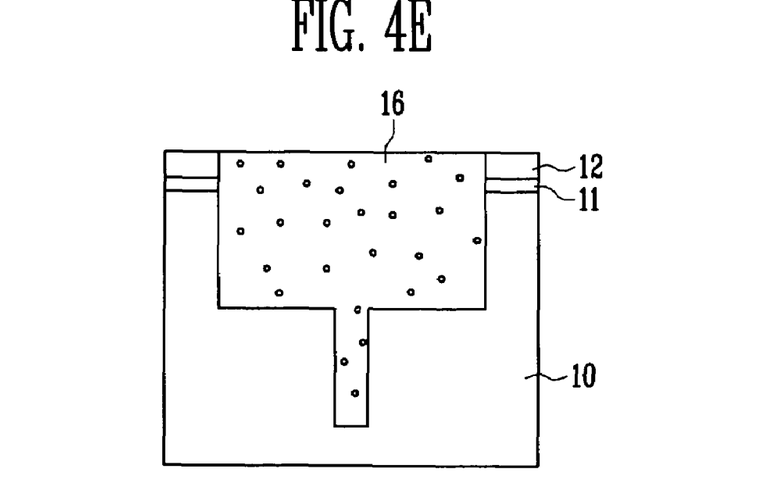

Referring to FIG. 4E, an insulating film having a sufficient thickness is formed to fill the trench 15. The insulating film is planarized using a Chemical Mechanical Polishing (CMP) process until the insulating film is substantially flushed to the pad nitride film 12. As a result, an isolation structure 16 is defined within in the trench 15.

FIGS. 5A to 5E are cross-sectional views illustrating a method of manufacturing an isolation structure of a semiconductor device according to a second embodiment of the present invention.

Figure 5A:
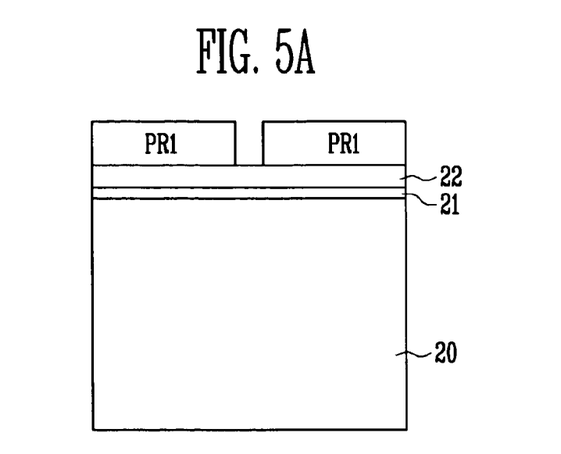
FIGS. 5A to 5E are cross-sectional views illustrating a method of manufacturing an isolation structure of a semiconductor device according to a second embodiment of the present invention.

As shown in FIG. 5A, a pad oxide film 21 and a pad nitride film 22 are formed over a semiconductor substrate 20. A first photoresist PR1 is coated over the pad nitride film 22. The first photoresist PR1 is patterned by an exposure and development process so that a portion of the isolation region is opened.

Figure 5B:
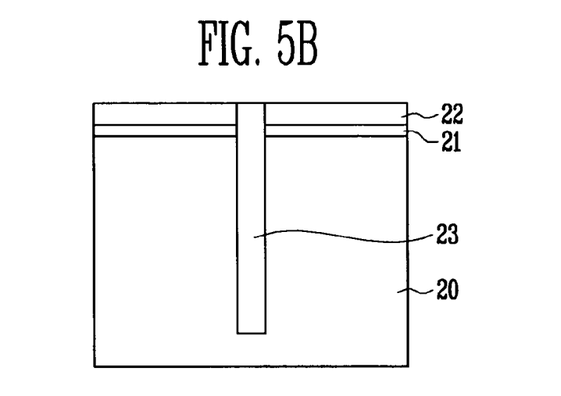

As shown in FIG. 5B, the pad nitride film 22, the pad oxide film 21 and the semiconductor substrate 20 are etched to form a first trench having a high aspect ratio by an anisotropic etch process using the patterned first photoresist PR1 as an etch mask. The first photoresist PR1 is then stripped.

To improve the device isolation characteristic, field-stop ions may be injected into the semiconductor substrate 20 below the first trench before the first photoresist PR1 is stripped.

A first insulating film 23 is then deposited on the entire surface so that the first trench is substantially filled with the first insulating film 23. The entire surface is planarized using a CMP process until the first insulating film 23 is substantially flushed to the pad nitride film 22. A portion of the first insulating film 23 remains within the first trench. Although only one first trench is illustrated, a plurality of the first trench may be formed in other implementations.

Figure 5C:
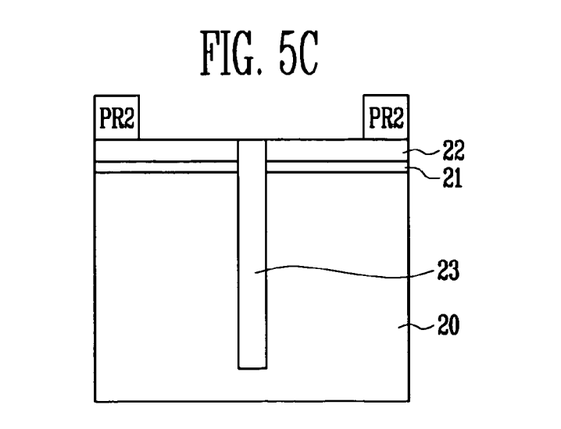

As shown in FIG. 5C, a second photoresist PR2 is coated over the entire surface. The second photoresist PR2 is patterned by an exposure and development process so that the entire isolation region is opened.

Figure 5D:
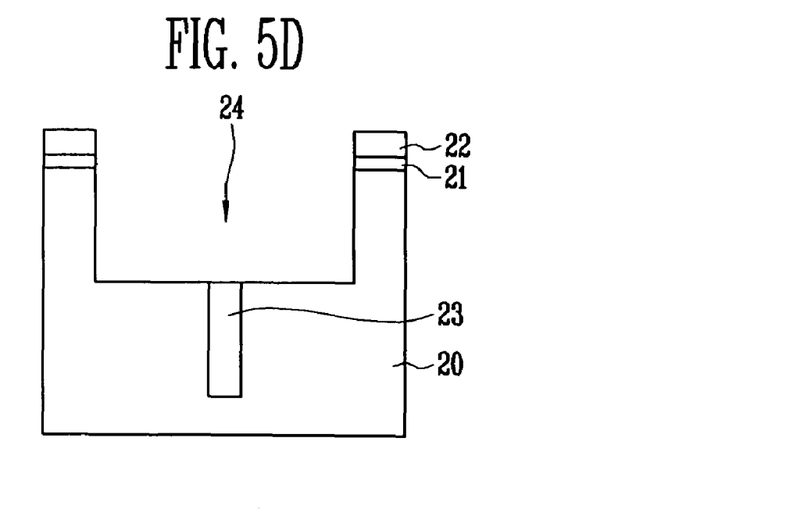

Thereafter, as shown in FIG. 5D, the pad nitride film 22, the pad oxide film 21, the first trench insulating film 23 and the semiconductor substrate 20 are etched to have a depth shallower than that of the first trench by an anisotropic etch process using the patterned second photoresist PR2, thereby forming a second trench 24.

In the etch process, the anisotropic etch process is used in the present embodiment to accurately control the width of the second trench 24, and thus the width of an isolation structure that is to be formed within the second trench.

In the present embodiment, the first trench extends at least 100 Å deeper into the substrate then the second trench.

Figure 5E:
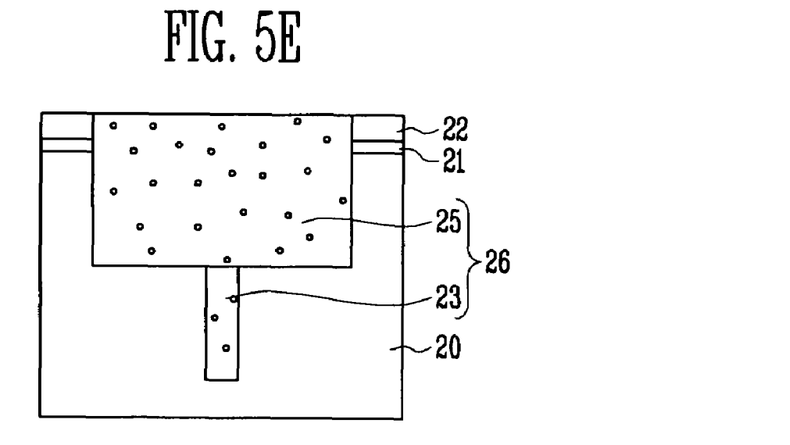

As shown in FIG. 5E, a second insulating film 25 is formed over the second trench 24 and fills the second trench. The second insulating film 25 is reduced in thickness using a CMP process until the second insulating film 25 is substantially flushed to the pad nitride film 22. The portion of the second insulating film 25 that fills the second trench 24 remains on the substrate.

As a result, an isolation structure 26 of a dual structure in which the first insulating film 23 and the second insulating film 25 are overlapping is formed.

FIGS. 6A to 6E are cross-sectional views illustrating a method of manufacturing an isolation structure of a semiconductor device according to a third embodiment of the present invention.

Figure 6A:
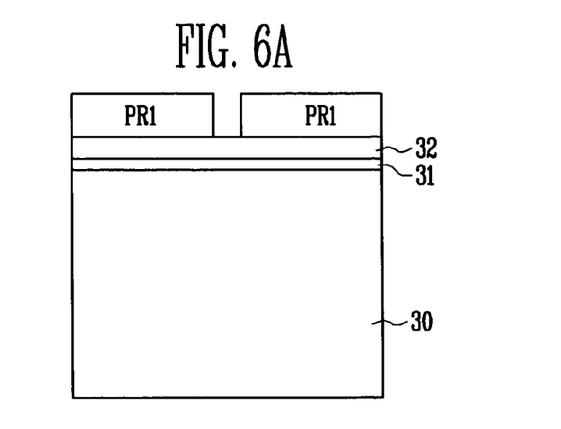
FIGS. 6A to 6E are cross-sectional views illustrating a method of manufacturing an isolation structure of a semiconductor device according to a third embodiment of the present invention.

As shown in FIG. 6A, a pad oxide film 31 and a pad nitride film 32 are sequentially formed on a semiconductor substrate 30. A first photoresist PR1 is coated on the pad nitride film 32. The first photoresist PR1 is patterned by an exposure and development process so that a portion of the isolation region is opened.

Figure 6B:
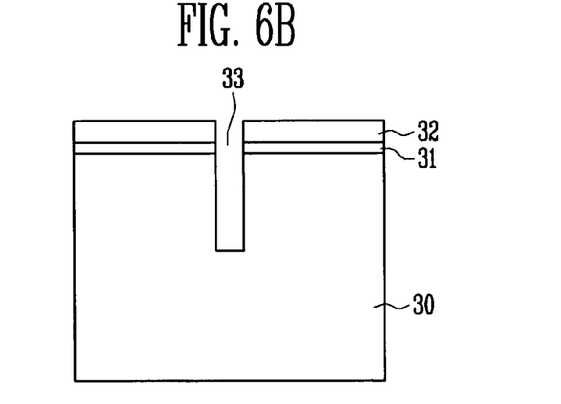

As shown in FIG. 6B, the pad nitride film 32, the pad oxide film 31 and the semiconductor substrate 30 are etched to form a first trench 33 having a high aspect ratio by an anisotropic etch process using the patterned first photoresist PR1 as an etch mask.

Figure 6C:
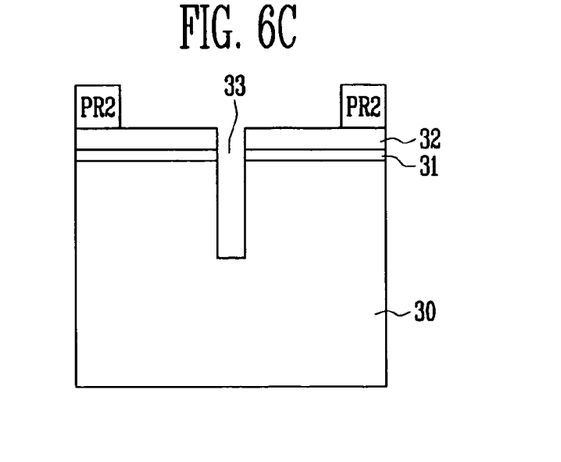

Thereafter, as show in FIG. 6C, a second photoresist PR2 is coated on the entire surface. The second photoresist PR2 is patterned by means of an exposure and development process so that the entire isolation region is opened.

Figure 6D:
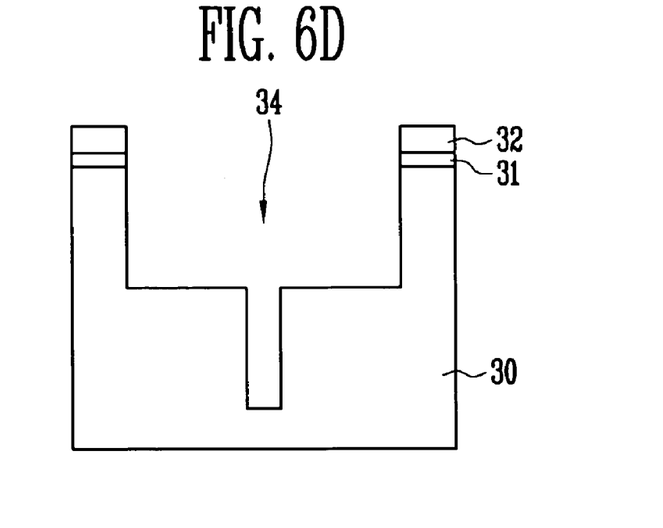

As shown in FIG. 6D, the exposed pad nitride film 32, the exposed pad oxide film 31 and the exposed semiconductor substrate 30 are partially etched to form a second trench 34 of a dual structure by means of an anisotropic etch process using the patterned second photoresist PR2 as an etch mask.

Figure 6E:
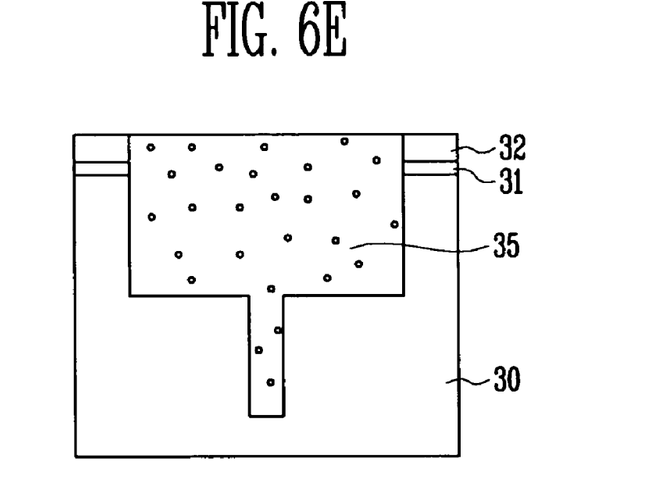

Thereafter, as shown in FIG. 6E, an insulating film is deposited to substantially fill the first trench 33 and the second trench 34. The insulating film is polished away using a CMP process until the insulating film is substantially flushed to the pad nitride film 32, so that an isolation structure 35 may be defined within the first and second trenches 33 and 34.

The embodiments of the present invention may be applied both to the peripheral region and the memory cell region in which the high voltage device is formed. However, the embodiments of the present invention are particularly advantageous when they are applied to a peripheral region that is vulnerable to field leakage due to the use of a high voltage.

Meanwhile, as described above, the embodiments of the present invention may be applied both to the peripheral region and the memory cell region. However, in order to prevent burial failure due to the burial of a trench having a locally narrow width in a memory cell region having a small pattern size, an isolation structure may be formed only in the peripheral region according to one embodiment of the present invention. An isolation structure having a single trench structure may be formed in the memory cell region in other embodiments.

As described above, the present invention has the following advantages.

First, since a vertical distance of the isolation region is extended, a width of the isolation region can be minimized. Therefore, the present invention is useful in making the devices smaller.

Figure 7:
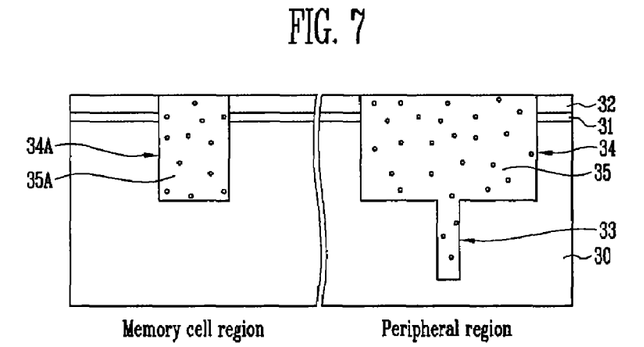
FIG. 7 is a cross-sectional view illustrating a memory cell region and a peripheral region, according to an embodiment of the invention.

Second, a deep trench is not formed in the memory cell region. It is therefore possible to prevent memory cell failure due to burial failure. As shown in FIG. 7, in the memory cell, an isolation structure 35A has a depth corresponding to the second trench 34, so the trench 34A for the isolation structure in the memory cell can be formed at the time the second trench 34 is formed in the peripheral region. The trench 34A formed in the memory region, however, may have a different width (e.g., smaller) than the width of the second trench 34.

Third, the number of process can be shortened and the device fabrication time may be shortened.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a semiconductor device, the method comprising:

forming a hard mask having a first opening over a semiconductor substrate;

etching the semiconductor substrate of a peripheral region to form a first trench in the peripheral region using the hard mask as an etch mask;

etching the hard mask to enlarge the first opening and to form a second opening in the hard mask, wherein the second opening is smaller than the first opening, the second opening being formed in a cell region;

etching the semiconductor substrate of the peripheral region and the cell region to form simultaneously a second trench in the peripheral region and a third trench in the cell region using the hard mask as an etch mask, wherein the first and second trenches together define a trench having a dual structure in the peripheral region; and forming a first isolation structure within the first and second trenches in the peripheral region and a second isolation structure within the third trench in the cell region, wherein a width of the second trench is larger than a width of the first trench, and a depth of the second trench is smaller than a depth of the first trench.

2. The method of claim 1, wherein the depth of the second trench is less than the depth of the first trench by at least 100 Å.

3. The method of claim 1, further comprising:
   injecting channel-stop ions below the second trench.

4. The method of claim 1, wherein the second trench is formed after the first trench.

5. The method of claim 1, further comprising:
   filling the first trench with a first insulating material; and
   filling the second trench with a second insulating material.

6. The method of claim 5, wherein the first insulating material and the second insulating material comprise substantially the same material.

7. The method of claim 5, wherein the first and second trenches are filled with the first and second insulating materials at different process steps.

8. The method of claim 1, wherein a depth of the third trench is less than the depth of the first trench.

9. The method of claim 8, wherein a width of the third trench is different from the width of the second trench.

10. The method of claim 1, wherein the hard mask includes a pad oxide film and a pad nitride film.

11. The method of claim 1, further comprising:
    implanting field-stop ions below the first trench prior to filling the first trench with the first insulating material.

* * * * *